(12) United States Patent
Hirayu

(10) Patent No.: US 8,304,260 B2
(45) Date of Patent: Nov. 6, 2012

(54) METHOD OF MANUFACTURING SEMICONDUCTOR DEVICE

(75) Inventor: Tsuyoshi Hirayu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,582

(22) Filed: Sep. 16, 2011

(65) Prior Publication Data

US 2012/0122248 A1 May 17, 2012

(51) Int. Cl.
*H01L 21/00* (2006.01)
(52) U.S. Cl. ............ 438/6; 438/129; 438/130; 430/314
(58) Field of Classification Search .............. 438/6, 130, 438/129, 311; 430/312, 313, 318, 327
See application file for complete search history.

(56) References Cited

U.S. PATENT DOCUMENTS

| 6,643,840 B2 * | 11/2003 | Kumagai ........................ 716/55 |
| 2006/0003498 A1 * | 1/2006 | Yamazaki et al. ............ 438/130 |

FOREIGN PATENT DOCUMENTS

JP 2002-184949 6/2002

* cited by examiner

*Primary Examiner* — Zandra Smith
*Assistant Examiner* — Damian A Hillman
(74) *Attorney, Agent, or Firm* — Turocy & Watson, LLP

(57) ABSTRACT

According to one embodiment, there is provided a method of manufacturing a semiconductor device having a buffer circuit. In the method, a plurality of semiconductor elements is formed on a semiconductor substrate. The plurality of semiconductor elements are connected in parallel to each other in the buffer circuit. In the method, driving forces of the formed semiconductor elements is evaluated. In the method, one mask is selected from a plurality of masks based on the evaluating. The plurality of masks are formed in advance to have different wiring mask patterns to cause the numbers of semiconductor elements connected in parallel with each other among the plurality of semiconductor elements of the buffer circuit to be different from each other. In the method, a wiring pattern corresponding to the wiring mask pattern is formed by using the selected one mask.

20 Claims, 5 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2010-252401, filed on Nov. 11, 2010; the entire contents of which are incorporated herein by reference.

FIELD

Embodiments described herein relate generally to a method of manufacturing a semiconductor device.

BACKGROUND

In order to correctly operate logic circuits and the like mounted on a semiconductor integrated circuit, it is required to set appropriate margin times in timing setting on setup times, hold times, and the like between internal signals of circuit blocks. This is because it is required to perform timing setting with appropriate room (margin) in anticipation of a change in power and a change in temperature in an environment in which the semiconductor integrated circuit operates.

DETAILED DESCRIPTION

Figure 1:
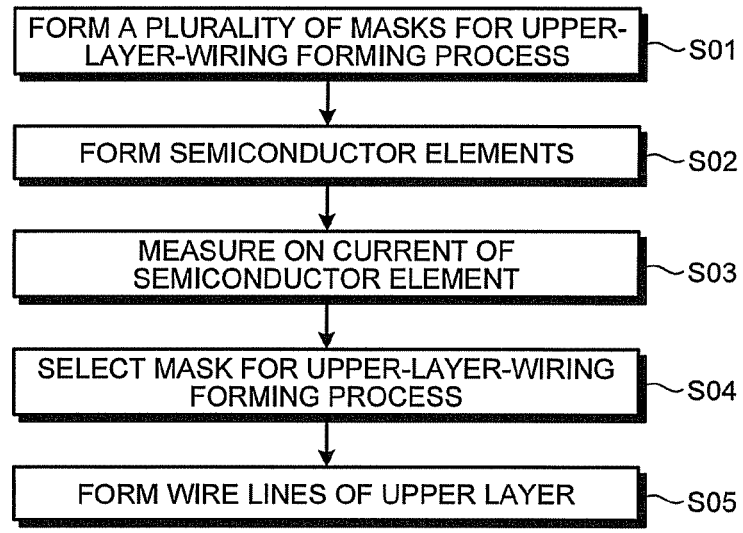
FIG. 1 is a block diagram illustrating a flow of processes of a method of manufacturing a semiconductor device according to an embodiment.

In general, according to one embodiment, there is provided a method of manufacturing a semiconductor device having a buffer circuit. In the method, a plurality of semiconductor elements is formed on a semiconductor substrate. The plurality of semiconductor elements are connected in parallel to each other in the buffer circuit. In the method, driving forces of the formed semiconductor elements is evaluated. In the method, one mask is selected from a plurality of masks based on the evaluating. The plurality of masks are formed in advance to have different wiring mask patterns to cause the numbers of semiconductor elements connected in parallel with each other among the plurality of semiconductor elements of the buffer circuit to be different from each other. In the method, a wiring pattern corresponding to the wiring mask pattern is formed by using the selected one mask.

Exemplary embodiments of a method of manufacturing a semiconductor device will be explained below in detail with reference to the accompanying drawings. The present invention is not limited to the following embodiments.

Embodiment

With recent demands for an increase in speed of semiconductor devices, it has been required to shorten timing margins between signals of each circuit element in designing operation timings of the circuit element.

Meanwhile, with the miniaturization of semiconductor devices, a variation of a characteristic of each circuit element (such as a MOS-type semiconductor element) constituting semiconductor integrated circuits has increased. This variation tends to occur between wafers. In a case where a timing margin is shortly designed as described above, if a variation of a characteristic of each circuit element increases, the timing margin is likely to be insufficient, and if the timing margin is insufficient, the circuit element may malfunction. That is, the likelihood of chips in which mounted circuit elements malfunction intends to increase, and a production yield of semiconductor integrated circuits intends to decrease.

On the other hand, it can be considered to measure a characteristic of a test element group (TEG) corresponding to each circuit element (such as a MOS-type semiconductor element) formed in advance and to adjust an amount of delay of a signal of the circuit element in response to the measurement result such that the timing of the signal of the circuit element is within a timing margin, during a manufacturing process. For example, it can be considered to prepare a plurality of photomasks different from each other in the number of connection stages of delay elements constituting a delay circuit, and to adjust the number of connection stages of delay elements to constitute a delay circuit by selecting, for example, a photomask for a wiring process in response to a measurement result of the characteristic of the TEG. This is considered to be able to put a timing of a signal of each circuit element (such as a MOS-type semiconductor element) in a timing margin even when there is a variation of the circuit element, for example, between wafers.

However, there is a timing issue that is difficult to cope with by adjusting the amount of delay. The issue is to suppress a change in slew rate in a circuit for which a change rate of signal transition (slew rate), such as a slope of a rising or falling of a clock signal in a synchronous design type, is important in timing design. Even if the amount of delay of the signal of the circuit element is adjusted, it is difficult to suppress the change in slew late. Therefore, even if the amount of delay of a signal of each circuit element is adjusted, it is difficult to put the timing of the signal of the circuit element in a timing margin.

Figure 2:
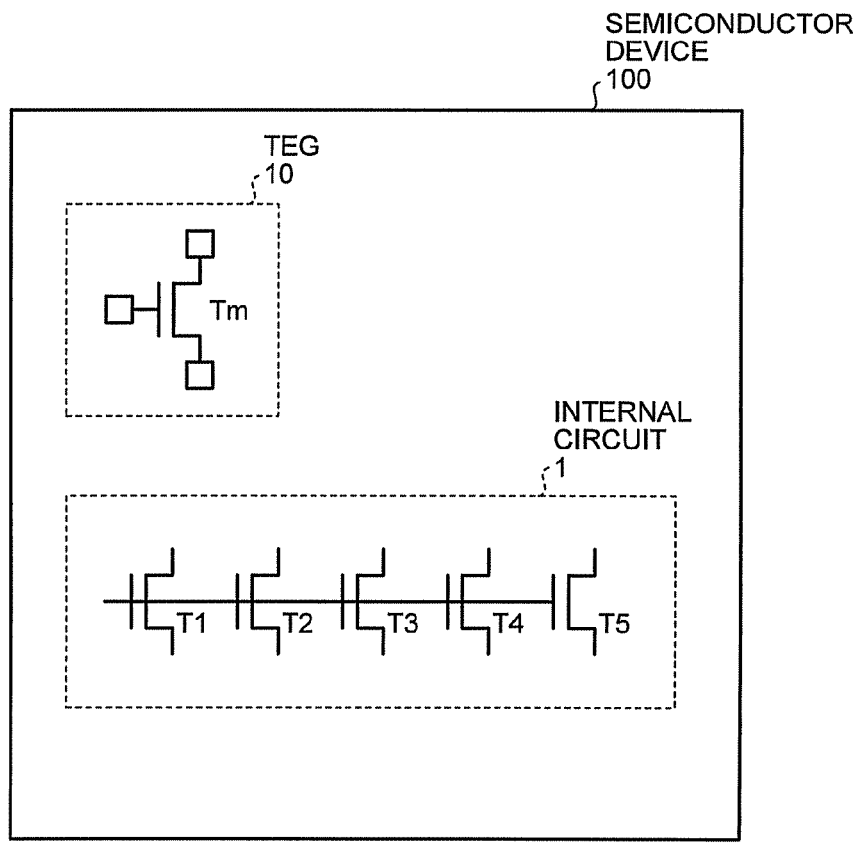
FIG. 2 is a diagram illustrating an example of a configuration of a semiconductor device manufactured by the manufacturing method of the embodiment.

With respect to this, the inventor of the present invention found that the change in slew rate results from a change in driving force of a buffer circuit (for example, a clock buffer circuit) for driving the signal. Specifically, as illustrated in FIG. 2, a semiconductor device 100 to be manufactured includes an internal circuit 1, and the internal circuit 1 includes a buffer circuit to which a plurality of semiconductor elements is connected in parallel. A signal of each circuit element is, for example, a clock signal, and the buffer circuit to which the plurality of semiconductor elements is connected in parallel is, for example, a clock buffer circuit. Variations in driving force of an output of the buffer circuit may have a great influence on a timing operation of another circuit element to receive a signal driven by the buffer circuit. For example, if the driving force of the output of the buffer circuit is smaller than a target value, since the slew rate becomes slow, signal degradation caused by interference between signals is likely to become marked, and a timing margin (an operation margin in a time axis direction) and an amplitude margin (an operation margin in an amplitude axis direction) in an operation waveform may narrow such that another circuit element to receive the signal driven by the buffer circuit can malfunction.

For this reason, the inventor of the present invention thought of, for example, preparing a plurality of masks for an upper-layer-wiring forming process different for each other in the number of semiconductor elements to be used for a buffer operation, in advance. That is, it was thought of connecting a plurality of MOS transistors T1 to T5 having characteristics equivalent to one another in parallel to form a buffer circuit while forming a TEG 10 including a MOS transistor Tm having a characteristic corresponding (for example, equivalent) to each of the MOS transistors T1 to T5 with the same mask layer as that for each of the MOS transistors T1 to T5, as illustrated in FIG. 2, evaluating a driving force of the TEG 10 (for example, by measuring an ON current), and selecting one mask from the plurality of masks prepared in advance, in response to the evaluation result, thereby changing the number of semiconductor elements used for the buffer operation among the plurality of semiconductor elements in the buffer circuit. That is, in the buffer circuit, the driving force of the circuit is determined according to the number of semiconductor elements used for the buffer operation. If the number of semiconductor elements increases, the driving force of the circuit increases, and if the number of semiconductor elements decreases, the driving force of the circuit decreases. This will be described below in detail.

Next, a flow of processes of the manufacturing method of the embodiment will be described with reference to a flow illustrated in FIG. 1. FIG. 1 is a flow chart illustrating the flow of processes of the method of manufacturing a semiconductor device according to the embodiment.

According to the method of manufacturing a semiconductor device, the number of parallel connections of parallel disposed elements included in a manufactured semiconductor device is changed in the upper-layer-wiring forming process. To this end, first, the plurality of masks for the upper-layer-wiring forming process is formed in step S01.

Figure 3A:
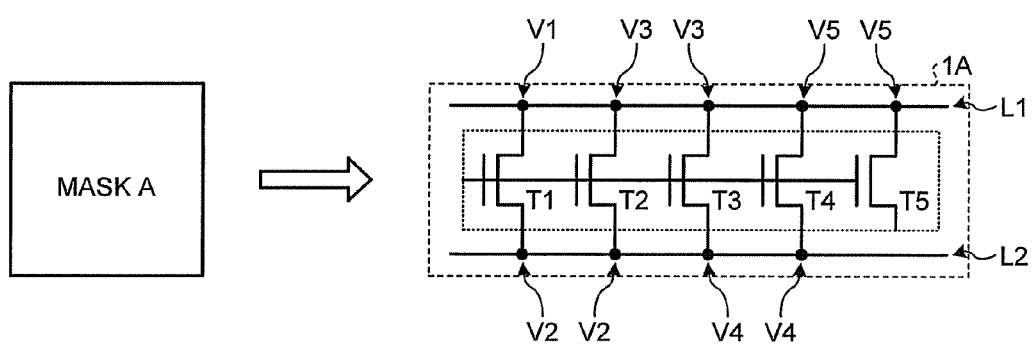
FIGS. 3A to 3C are diagrams illustrating examples of correspondence relations between masks and circuit connections.
Figure 3B:
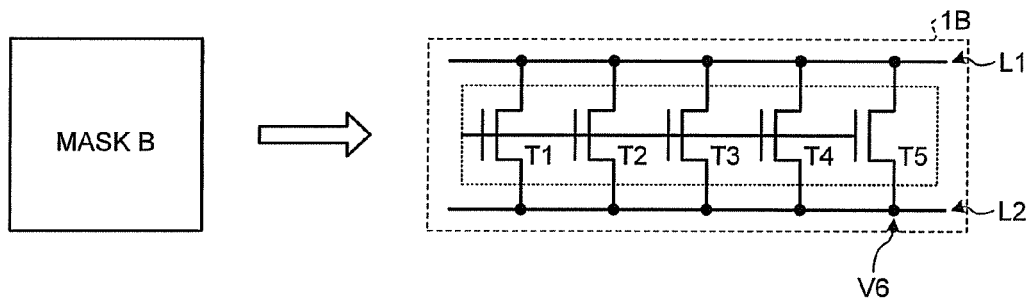
Figure 3C:
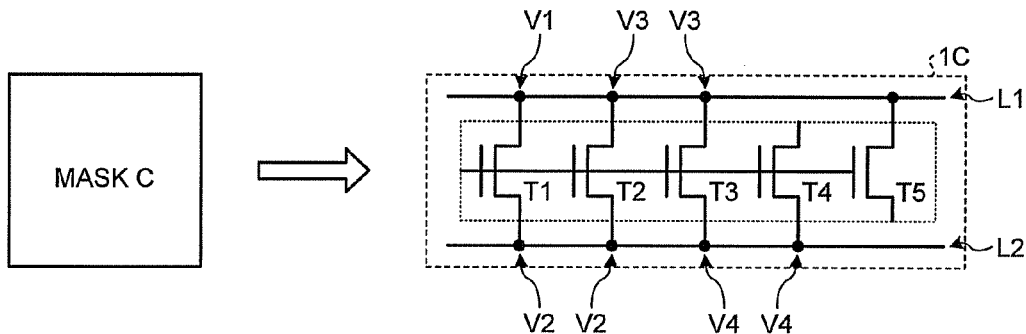

FIGS. 3A to 3C illustrate correspondence relations between the plurality of masks and the numbers of parallel connections of elements. FIGS. 3A to 3C illustrate the correspondence relations between three masks A, B, and C and the numbers of parallel connections of the MOS transistors T1 to T5, taking the MOS transistors T1 to T5 illustrated in FIG. 2 as an example.

As illustrated in FIG. 3A, in the mask A, a mask pattern for connecting four MOS transistors T1 to T4 in parallel is formed. That is, the mask A has a first wiring mask pattern (see FIGS. 5A and 6A) for connecting the four MOS transistors T1 to T4 in parallel. Specifically, among the plurality of MOS transistors T1 to T5 to become candidates to be connected parallel, the mask A connects the sources and drains of the four MOS transistors T1 to T4 to corresponding lines L1 and L2, and electrically disconnects at least one of the source and drain of one remaining MOS transistor T5 from a corresponding line L1 or L2.

As illustrated in FIG. 3B, in the mask B, a mask pattern for connecting the five MOS transistors T1 to T5 in parallel is formed. That is, the mask B has a second wiring mask pattern (see FIGS. 5B and 6B) for connecting the five MOS transistors T1 to T5 in parallel. Specifically, among the plurality of MOS transistors T1 to T5 to become candidates to be connected parallel, the mask B connects the sources and drains of, for example, all of the five MOS transistors T1 to T5 to corresponding lines L1 and L2.

As illustrated in FIG. 3C, in the mask C, a mask pattern for connecting three MOS transistors T1 to T3 in parallel is formed. That is, the mask C has a third wiring mask pattern (see FIGS. 5C and 6C) for connecting the three MOS transistors T1 to T3 in parallel. Specifically, among the plurality of MOS transistors T1 to T5 to become candidates to be connected parallel, the mask C connects the sources and drains of the three MOS transistors T1 to T3 to corresponding lines L1 and L2, and electrically disconnects at least one of the source and drain of each of two remaining MOS transistors T4 and T5 from a corresponding line L1 or L2.

Here, it is assumed that the standard value of the number of parallel connections of MOS transistors is set to be four, the mask A is used when the number of parallel connections is the standard value, the mask B is used to make the number of parallel connections larger than the standard value, and the mask C is used to make the number of parallel connections smaller than the standard value.

Returning to FIG. 1, in step S02, semiconductor elements are formed on a semiconductor substrate. By means of step S02, the MOS transistors T1 to T5 of the internal circuit 1, the MOS transistor Tm of the TEG 10, and the like are formed.

Next, contact holes, metal wiring lines of a first layer, and the like are formed so as to connect the source/drain regions of the MOS transistors to the metal wire lines of the first layer. By means of this, pads for measurement connected to the MOS transistor Tm of the TEG 10 are formed.

Then, in the present embodiment, prior to proceeding to the upper-layer-wiring forming process, in step S03, the ON current $I_{on}$, that is, driving force of the MOS transistor Tm of the TEG 10 is measured.

The driving force of the MOS transistor increases as the ON current $I_{on}$ increases, and the ON current $I_{on}$ needs to be in a predetermined range in timing design. However, the ON current $I_{on}$ has a variation in manufacturing not only between wafers but also in one wafer. Therefore, it is possible to grasp the degree of the variation in a wafer and between wafers by measuring the MOS transistor Tm of the TEG 10.

Figure 4A:
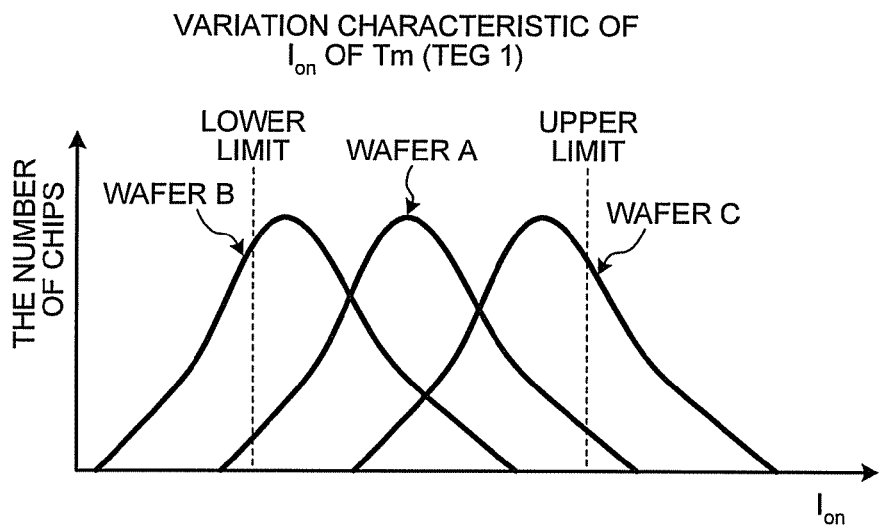
FIGS. 4A and 4B are explanatory diagrams of a variation improvement effect of the manufacturing method of the embodiment.
Figure 4A:
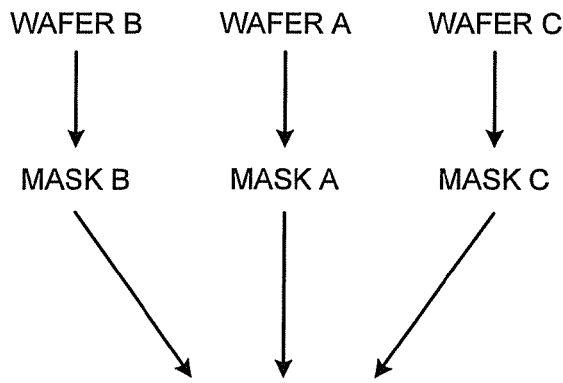

FIG. 4A illustrates states of the variations of the ON currents $I_{on}$ of the MOS transistors Tm of the TEGs 10 in wafers and between the wafers. In FIG. 4A, a horizontal axis represents the magnitude of the ON current $I_{on}$, and a vertical axis represents the number of chips in a wafer. Also, FIG. 4A illustrates an upper limit and a lower limit of an allowable range in timing design.

In FIG. 4A, a wafer A has a distribution of an ON current $I_{on}$ with a center positioned in the middle of the allowable range, and illustrates the most standard variation. That is, in the wafer A, the ON current $I_{on}$, that is, driving force of a single MOS transistor is standard. In contrast, the wafer B has a distribution of an ON current $I_{on}$ with a center positioned in the vicinity of the lower limit of the allowable range, and the wafer C has a distribution of an ON current $I_{on}$ with a center positioned in the vicinity of the upper limit of the allowable range. This means that the ON current $I_{on}$, that is, driving force of a single MOS transistor of the wafer B is slightly insufficient, and the ON current $I_{on}$, that is, driving force of a single MOS transistor of the wafer C is slightly excessive.

Next, in the present embodiment, in step S04, a mask for the upper-layer-wiring forming process is selected in response to the distribution of the variation of the ON current $I_{on}$ of the single MOS transistor of each wafer.

That is, the mask A is selected with respect to the wafer A having the standard ON current $I_{on}$, the mask B is selected with respect to the wafer B having the slightly insufficient ON current $I_{on}$, and the mask C is selected with respect to the wafer C having the slightly excessive ON current $I_{on}$.

Subsequently, in step S05, upper wire lines are formed using the selected mask. As a result, the number of parallel connections of MOS transistors of the internal circuit 1 is four in the wafer A, five in the wafer B, and three in the wafer C. Therefore, the number of parallel connections of MOS transistors of the wafer B increases from the standard value, such that an entire ON current $I_{on}$ of a parallel connected circuit increases. Meanwhile, the number of parallel connections of MOS transistors of the wafer C decreases from the standard value, such that an entire ON current $I_{on}$ of a parallel connected circuit decreases.

Figure 4B:
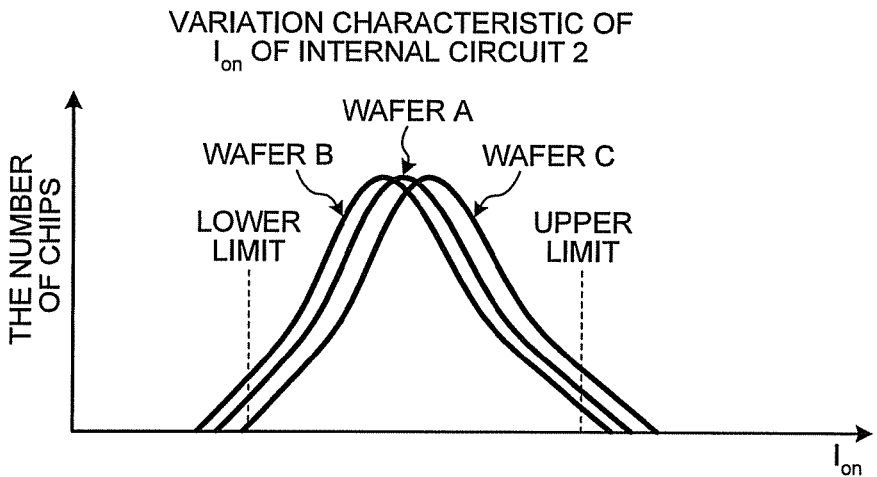

As a result, as illustrated in FIG. 4B, the variations in the distributions of the ON currents $I_{on}$ of circuits, having MOS transistors connected in parallel, among the wafers are improved such that more chips are put in the allowable variation range. Therefore, the production yield of semiconductor devices is improved.

Figure 5A:
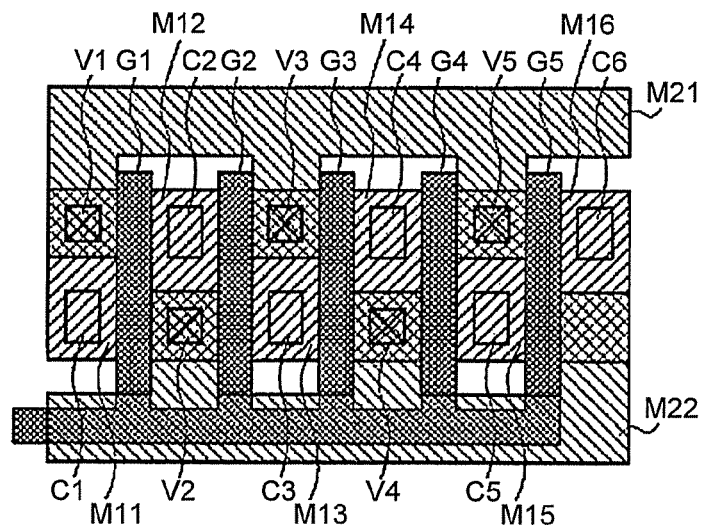
FIGS. 5A to 5C are diagrams illustrating examples of pattern layouts of a plurality of masks when selected masks are used as masks for forming via holes.
Figure 5B:
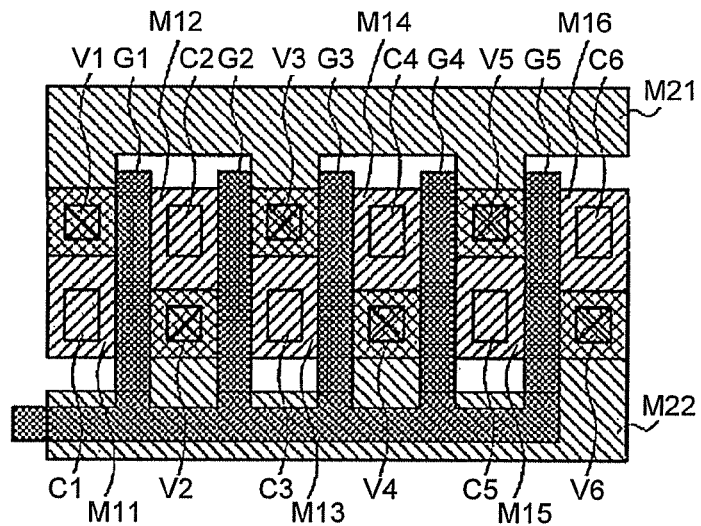
Figure 5C:
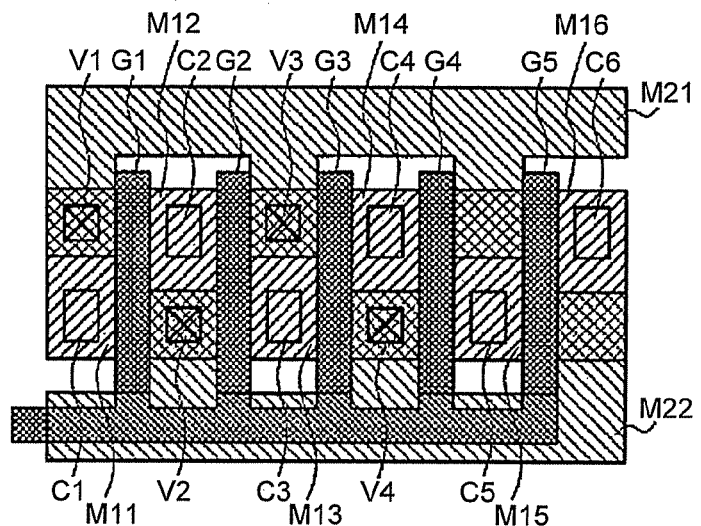
Figure 6A:
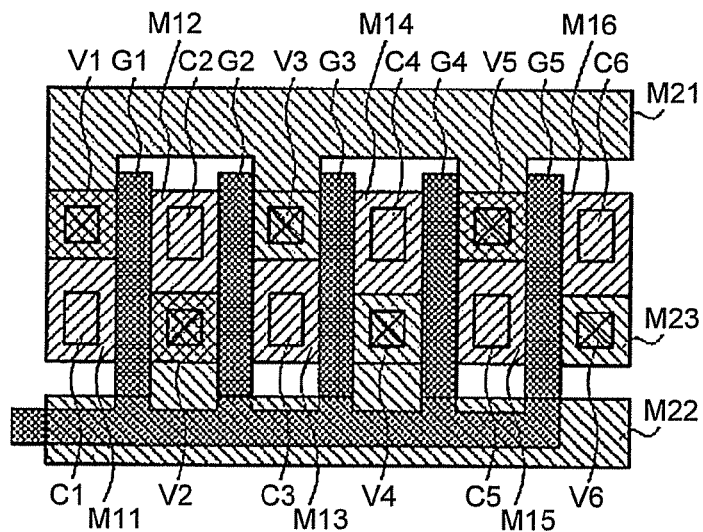
FIGS. 6A to 6C are diagrams illustrating examples of pattern layouts of a plurality of masks when selected masks are used as masks for forming metal wire lines of upper layers.
Figure 6B:
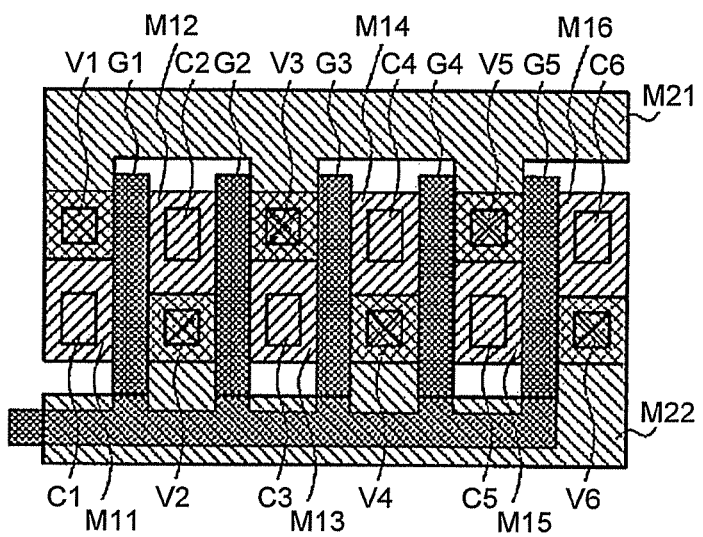
Figure 6C:
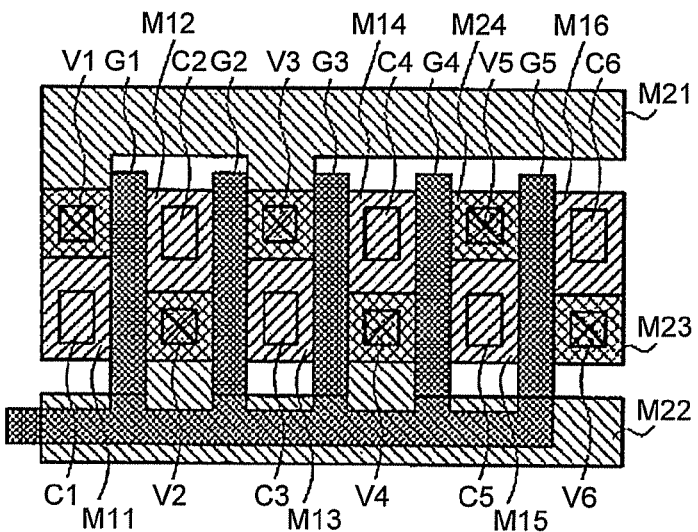

FIGS. 5A to 5C and 6A to 6C illustrate specific examples of the mask patterns. FIGS. 5A to 5C illustrate examples in which a plurality of masks for forming via holes is formed as the plurality of masks for the upper-layer-wiring forming process prepared in step S01, and FIGS. 6A to 6C illustrate examples in which a plurality of masks for forming metal wire lines of an upper layer is formed as the plurality of masks for the upper-layer-wiring forming process prepared in step S01. It should be noted that FIGS. 5A to 5C and 6A to 6C illustrate the mask patterns such that a plurality of mask layers overlaps, and illustrate corresponding actually formed layout patterns.

FIGS. 5A to 5C also illustrate metal-wiring patterns M11 to M16 for the first layer, contact patterns C1 to C6, gate-electrode patterns G1 to G5, and metal-wiring patterns M21 and M22 for the upper layer.

FIG. 5A illustrates the pattern of the mask A in which via-hole patterns V1 to V5 are formed to connect the metal wire lines of the first layer and the metal wire lines of the upper layer.

FIG. 5B illustrates the pattern of the mask B in which via-hole patterns V1 to V6 are formed to connect the metal wire lines of the first layer and the metal wire lines of the upper layer.

FIG. 5C illustrates the pattern of the mask C in which via-hole patterns V1 to V4 are formed to connect the metal wire lines of the first layer and the metal wire lines of the upper layer.

Meanwhile, in FIGS. 6A to 6C, the via-hole patterns V1 to V6 are formed in common, and metal-wiring patterns for upper layers are different according to the masks.

FIG. 6A illustrates the pattern of the mask A in which, in addition to the metal-wiring patterns M21 and M22 for the upper layer, a metal-wiring pattern M23 for the upper layer is formed in the vicinity of the via-hole pattern V6 so as to disconnect the via-hole pattern V6 from the metal-wiring patterns M21 and M22. In this case, electrically, the metal-wiring pattern M16 for the first layer is disconnected from any one of the metal-wiring patterns M21 and M22 for the upper layer. The pattern of the mask A illustrated in FIG. 6A may be combined with the pattern of the mask A illustrated in FIG. 5A. That is, the pattern of the mask A may be obtained by removing the via-hole pattern V6 in FIG. 6A.

FIG. 6B illustrates the pattern of the mask B in which the metal-wiring patterns M21 and M22 for the upper layer are formed. In this case, electrically, all the metal wire lines of the first layer are connected to any one of the metal-wiring patterns M21 and M22 for the upper layer.

FIG. 6C illustrates the pattern of the mask C in which, in addition to the metal-wiring patterns M21 and M22 for the upper layer, the metal-wiring pattern M23 for the upper layer is formed in the vicinity of the via-hole pattern V6 so as to disconnect the via-hole pattern V6 from the metal-wiring patterns M21 and M22, and a metal-wiring pattern M24 for the upper layer is formed in the vicinity of the via-hole pattern V5 so as to disconnect the via-hole pattern V5 from the metal-wiring patterns M21 and M22. In this case, electrically, the metal-wiring patterns M16 and M15 for the first layer are disconnected from any one of the metal-wiring patterns M21 and M22 for the upper layer. The pattern of the mask C illustrated in FIG. 6C may be combined with the pattern of the mask C illustrated in FIG. 5C. That is, the pattern of the mask C may be obtained by removing the via-hole patterns V5 and V6 in FIG. 6C.

According to the manufacturing method of the present embodiment described above, prior to proceeding to the upper-layer-wiring forming process, it is possible to measure the ON current of the MOS transistor and select a mask for the upper-layer-wiring forming process in response to the measurement result. Therefore, even if there is a variation in an ON current, that is, driving force of a single MOS transistor, it is possible to suppress variations in the driving forces of circuits to which MOS transistors are connected in parallel between wafers. Also, it is possible to improve the production yield of semiconductor devices.

It should be noted that, although in the above-mentioned embodiment the ON current of the MOS transistor of the TEG 10 is measured, an ON current of a MOS transistor included in the internal circuit 1 may be measured by using a nano-probe apparatus.

It should be also noted that, although in the above-mentioned embodiment a mask is selected for each wafer, a mask is selected for each chip of a wafer. In this case, even if the characteristic of each circuit element varies for each chip of the wafer, it is possible to suppress a variation between chips, and further improve the production yield of semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device having a buffer circuit, comprising:
    forming a plurality of semiconductor elements on a semiconductor substrate, the plurality of semiconductor elements connected in parallel to each other in the buffer circuit;
    evaluating driving forces of the formed semiconductor elements;
    selecting one mask from a plurality of masks based on the evaluating, the plurality of masks being formed in advance to have different wiring mask patterns to cause the numbers of semiconductor elements connected in parallel with each other among the plurality of semiconductor elements of the buffer circuit to be different from each other; and forming a wiring pattern corresponding to the wiring mask pattern by using the selected one mask.

2. The method of manufacturing a semiconductor device according to claim 1, wherein
the forming of the plurality of semiconductor elements further includes forming a second semiconductor element having a characteristic corresponding to a characteristic of each of the plurality of semiconductor elements, and
the evaluating includes evaluating the driving forces of the semiconductor elements by measuring an ON current of the second semiconductor element.

3. The method of manufacturing a semiconductor device according to claim 2, wherein
the forming of the plurality of semiconductor elements and the forming of the second semiconductor element are performed by the same mask layer, and
the selected one mask is used as a mask layer later than the same mask layer.

4. The method of manufacturing a semiconductor device according to claim 2, wherein
the forming of the plurality of semiconductor elements and the second semiconductor element includes forming a plurality of chips on the semiconductor substrate, each of the plurality of chips including the plurality of semiconductor elements and the second semiconductor element, and
the evaluating includes measuring the ON current of the second semiconductor element for the plurality of chips, and includes evaluating a distribution of the ON currents of the second semiconductor elements of the plurality of chips.

5. The method of manufacturing a semiconductor device according to claim 2, wherein
the plurality of masks includes
a first mask having a first wiring mask pattern to cause the number of semiconductor elements connected in parallel with each other in the buffer circuit to be a first value,
a second mask having a second wiring mask pattern to cause the number of semiconductor elements connected in parallel with each other in the buffer circuit to be a second value larger than the first value, and
a third mask having a third wiring mask pattern to cause the number of semiconductor elements connected in parallel with each other in the buffer circuit to be a third value smaller than the first value.

6. The method of manufacturing a semiconductor device according to claim 5, wherein
the evaluating includes evaluating a relation between a driving force of the second semiconductor element and an allowable range, and
the selecting includes selecting the first mask when the driving force of the second semiconductor element is in the allowable range, selecting the second mask when the driving force of the second semiconductor element is insufficient with respect to the allowable range, and selecting the third mask when the driving force of the second semiconductor element is excessive with respect to the allowable range.

7. The method of manufacturing a semiconductor device according to claim 5, wherein
the forming of the plurality of semiconductor elements and the second semiconductor element includes forming a plurality of chips on the semiconductor substrate, each of the plurality of chips including the plurality of semiconductor elements and the second semiconductor element,
the evaluating includes measuring the ON current of the second semiconductor element for the plurality of chips, and includes evaluating a relation between a distribution of the ON currents of the second semiconductor elements of the plurality of chips and an allowable range, and
the selecting includes selecting the first mask when the distribution of the ON currents of the second semiconductor elements is in the allowable range, selecting the second mask when the distribution of the ON currents of the second semiconductor elements is insufficient with respect to the allowable range, and selecting the third mask when the distribution of the ON currents of the second semiconductor elements is excessive with respect to the allowable range.

8. The method of manufacturing a semiconductor device according to claim 1, wherein
the evaluating includes evaluating the driving forces of the semiconductor elements by measuring ON currents of the semiconductor elements.

9. The method of manufacturing a semiconductor device according to claim 8, wherein
the selected one mask is used as a mask layer later than a mask layer used for the forming of the plurality of semiconductor elements.

10. The method of manufacturing a semiconductor device according to claim 8, wherein
the forming of the plurality of semiconductor elements includes forming a plurality of chips on the semiconductor substrate, each of the plurality of chips including the plurality of semiconductor elements, and
the evaluating includes measuring an ON current of the semiconductor element for the plurality of chips, and includes evaluating a distribution of the ON currents of the semiconductor elements of the plurality of chips.

11. The method of manufacturing a semiconductor device according to claim 8, wherein
the plurality of masks includes
a first mask having a first wiring mask pattern to cause the number of semiconductor elements connected in parallel with each other in the buffer circuit to be a first value,
a second mask having a second wiring mask pattern to cause the number of semiconductor elements connected in parallel with each other in the buffer circuit to be a second value larger than the first value, and
a third mask having a third wiring mask pattern to cause the number of semiconductor elements connected in parallel with each other in the buffer circuit to be a third value smaller than the first value.

12. The method of manufacturing a semiconductor device according to claim 11, wherein
the evaluating includes evaluating a relation between a driving force of the semiconductor element and an allowable range, and
the selecting includes selecting the first mask when the driving force of the semiconductor element is in the allowable range, selecting the second mask when the driving force of the semiconductor element is insufficient with respect to the allowable range, and selecting the third mask when the driving force of the second semiconductor element is excessive with respect to the allowable range.

13. The method of manufacturing a semiconductor device according to claim 11, wherein the forming of the plurality of semiconductor elements includes forming a plurality of chips on the semiconductor substrate, each of the plurality of chips including the plurality of semiconductor elements, the evaluating includes measuring the ON current of the semiconductor element for the plurality of chips, and includes evaluating a relation between a distribution of the ON currents of the semiconductor elements of the plurality of chips and an allowable range, and the selecting includes selecting the first mask when the distribution of the ON currents of the semiconductor elements is in the allowable range, selecting the second mask when the distribution of the ON currents of the semiconductor elements is insufficient with respect to the allowable range, and selecting the third mask when the distribution of the ON currents of the semiconductor elements is excessive with respect to the allowable range.

14. The method of manufacturing a semiconductor device according to claim 1, wherein the forming of the plurality of semiconductor elements includes forming the plurality of semiconductor elements on the semiconductor substrate for each of a plurality of semiconductor substrates, and the selecting includes selecting the one mask for each of the plurality of semiconductor substrates.

15. The method of manufacturing a semiconductor device according to claim 1, wherein the forming of the plurality of semiconductor elements includes forming a plurality of chips on the semiconductor substrate for each of a plurality of semiconductor substrates, each of the plurality of chips including the plurality of semiconductor elements, and the selecting includes selecting the one mask for each of the plurality of semiconductor substrates.

16. The method of manufacturing a semiconductor device according to claim 1, wherein the plurality of semiconductor elements is a plurality of MOS transistors.

17. The method of manufacturing a semiconductor device according to claim 16, wherein the plurality of masks have different wiring mask patterns to cause the numbers of connections each between a source/drain of a MOS transistor and a corresponding line to be different from each other, so as to cause the numbers of semiconductor elements connected in parallel with each other among the plurality of semiconductor elements of the buffer circuit to be different from each other.

18. The method of manufacturing a semiconductor device according to claim 17, wherein the plurality of masks includes different via-hole mask patterns to cause the numbers of via-hole patterns connected with sources/drains of the plurality of MOS transistors to be different from each other.

19. The method of manufacturing a semiconductor device according to claim 17, wherein the plurality of masks includes different line mask patterns to cause shapes of line patterns connected with sources/drains of the plurality of MOS transistors through via-hole patterns to be different from each other.

20. The method of manufacturing a semiconductor device according to claim 17, wherein the plurality of masks includes different via-hole mask patterns to cause the numbers of via-hole patterns connected with sources/drains of the plurality of MOS transistors to be different from each other, and includes different line mask patterns to cause shapes of line patterns connected with sources/drains of the plurality of MOS transistors through via-hole patterns to be different from each other.

* * * * *